(12) United States Patent
Leighton et al.

(10) Patent No.: US 6,707,625 B2
(45) Date of Patent: Mar. 16, 2004

(54) DUAL-SENSE IMPEDANCE-MATCHED READER

(75) Inventors: John D. Leighton, Anoka, MN (US); Carl Elliott, Eden Prairie, MN (US); Jonathan P. Comeau, Minneapolis, MN (US)

(73) Assignee: Agere Systems Inc., Allentown, PA (US)

( * ) Notice: Subject to any disclaimer, the term of this patent is extended or adjusted under 35 U.S.C. 154(b) by 372 days.

(21) Appl. No.: 09/797,399

(22) Filed: Mar. 1, 2001

(65) Prior Publication Data

US 2002/0154431 A1 Oct. 24, 2002

(51) Int. Cl.$^7$ ............................ G11B 5/09; G11B 5/02
(52) U.S. Cl. .................................... 360/46; 360/67
(58) Field of Search ............... 360/46, 67; G11B 5/09, G11B 5/02

(56) References Cited

U.S. PATENT DOCUMENTS 6,265,905 B1 * 7/2001 Jove et al. ..................... 327/51
6,271,977 B1 * 8/2001 Chung et al. .................. 360/46
6,420,910 B1 * 7/2002 Contreras et al. ............. 327/77

OTHER PUBLICATIONS

Leighton et al, IEEE Transactions on Magnetics, vol. 37, No. 2, Mar. 2001, pp. 627–632.*
Howard W. Johnson and Martin Graham, *"High–Speed Digital Design"*, 1993, p. 161, Prentice Hall PTR, New Jersey.

* cited by examiner

*Primary Examiner*—David Hudspeth
*Assistant Examiner*—Dan I. Davidson
(74) *Attorney, Agent, or Firm*—Kinney & Lange, P.A.

(57) ABSTRACT

A preamplifier system is connected through an interconnect to a read head. The preamplifier system includes a voltage-sense preamplifier having at least one input connected through the interconnect to the read head and having at least one output, and also includes a current-sense preamplifier having at least one input connected through the interconnect to the read head and having at least one output. A summing circuit is connected to combine the outputs of the voltage-sense preamplifier and the current-sense preamplifier. For optimal performance, the preamplifier system is impedance matched to the interconnect. The preamplifier system achieves excellent response due to impedance matching with acceptably low noise levels, since the correlated noise associated with the current-sense preamplifier is canceled at the summing circuit.

22 Claims, 4 Drawing Sheets

DUAL-SENSE IMPEDANCE-MATCHED READER

BACKGROUND OF THE INVENTION

The present invention relates to a preamplifier for a magnetoresistive (MR) read system, and more particularly to an impedance-matched read system employing both a voltage-sense amplifier and a current-sense amplifier to achieve improved response.

A popular method of magnetic data storage utilizes MR heads to store and recover data on a magnetic data storage medium such as a magnetic disk. An MR head employs an MR element that changes in resistivity with changing magnetic flux from data patterns on an adjacent magnetic disk surface. When the MR element is properly coupled to a read circuit amplifier, the amplifier senses, or detects, the resistance of the MR element as a voltage or current signal representing the magnetic flux from the disk. This signal is amplified by a preamplifier circuit for manipulation and analysis, so that the data recorded on the disk may be accurately recovered.

As a general rule, matching the impedances of cooperating circuits and/or transmission lines achieves the most desirable circuit response characteristics, eliminating the effects of mismatch-caused signal reflections on the performance of the circuit which occur at high frequencies. Impedance matching therefore increases the effective bandwidth of the circuit. Preamplifier circuits are no different in this respect, and optimal preamplifier performance would be achieved if the impedances of either the preamplifier and the interconnect or the interconnect and the MR head were matched to one another. Precise impedance matching of the MR element and the interconnect is not practical because the impedance of the head is not a tightly controlled parameter in manufacturing. In most read systems, an approximate impedance match is not obtainable, since the MR element typically has an impedance between about 30 Ohms and about 80 Ohms, and the interconnect typically has an impedance of about 100 Ohms ($\Omega$). The preamplifier circuit therefore could potentially be impedance-matched to the interconnect, yielding a circuit with improved performance.

In addition to impedance matching, low noise is also required for effective preamplifier circuit performance. There are three general types of noise associated with preamplifier circuits: current noise, voltage noise and correlated noise, where correlated noise is simply the noise associated with those sources that generate both current noise and voltage noise in a correlated fashion. These three noise sources must all be constrained to sufficiently low levels for the preamplifier circuit to perform effectively.

Traditionally there have been two general types of preamplifier circuits utilized in MR read systems: voltage-sense preamplifiers and current-sense preamplifiers. Both of these types of preamplifiers are well known in the art. For a voltage-sense preamplifier circuit, a classic approach to match the impedance of the preamplifier to the impedance of the interconnect would be to connect a matching resistor between the input terminals of the preamplifier in parallel with the signal from the MR element. The resistance of the matching resistor would have a value equal to the characteristic impedance of the interconnect. However, introducing the matching resistor in this manner results in a significant increase in the current noise associated with the preamplifier, such that the preamplifier circuit is unable to perform effectively.

For a current-sense preamplifier circuit, a classic approach to match the impedance of the preamplifier to the impedance of the interconnect would be to connect a matching resistor in series with each of the input terminals of the preamplifier. The resistance of each matching resistor would have a value equal to half of the characteristic impedance of the interconnect. However, introducing the matching resistors in this manner results in a significant increase in the correlated noise associated with the preamplifier, such that the preamplifier circuit is unable to perform effectively. Another possible approach would be to increase the input impedance of the current-sense preamplifier by adjusting the bias current associated with the input transistors to increase the emitter resistance of those transistors so as to match the impedance of the transmission line. This approach also increases the correlated noise associated with the preamplifier in an undesirable manner.

There is a need in the art for an improved preamplifier circuit that is impedance matched without introducing excessive noise that would render the preamplifier circuit ineffective, and which also provides a sufficient level of gain. Such a preamplifier circuit is the subject of the present invention.

BRIEF SUMMARY OF THE INVENTION

The present invention is a preamplifier system for connection through an interconnect to a read head. The preamplifier system includes a voltage-sense preamplifier having at least one input connected through the interconnect to the read head and having at least one output, and also includes a current-sense preamplifier having at least one input connected through the interconnect to the read head and having at least one output. A summing circuit is connected to combine the outputs of the voltage-sense preamplifier and the current-sense preamplifier. For optimal performance, the preamplifier system is impedance matched to the interconnect. The preamplifier system achieves excellent response due to impedance matching with acceptably low noise levels, since the correlated noise associated with the current-sense preamplifier is canceled at the summing circuit. This is the most significant noise source in the dual-sense preamplifier system, and when canceled, the total noise of the impedance-matched preamplifier system is similar to the noise achieved by a non-impedance-matched voltage-sense or current-sense preamplifier alone.

DETAILED DESCRIPTION

Figure 1:
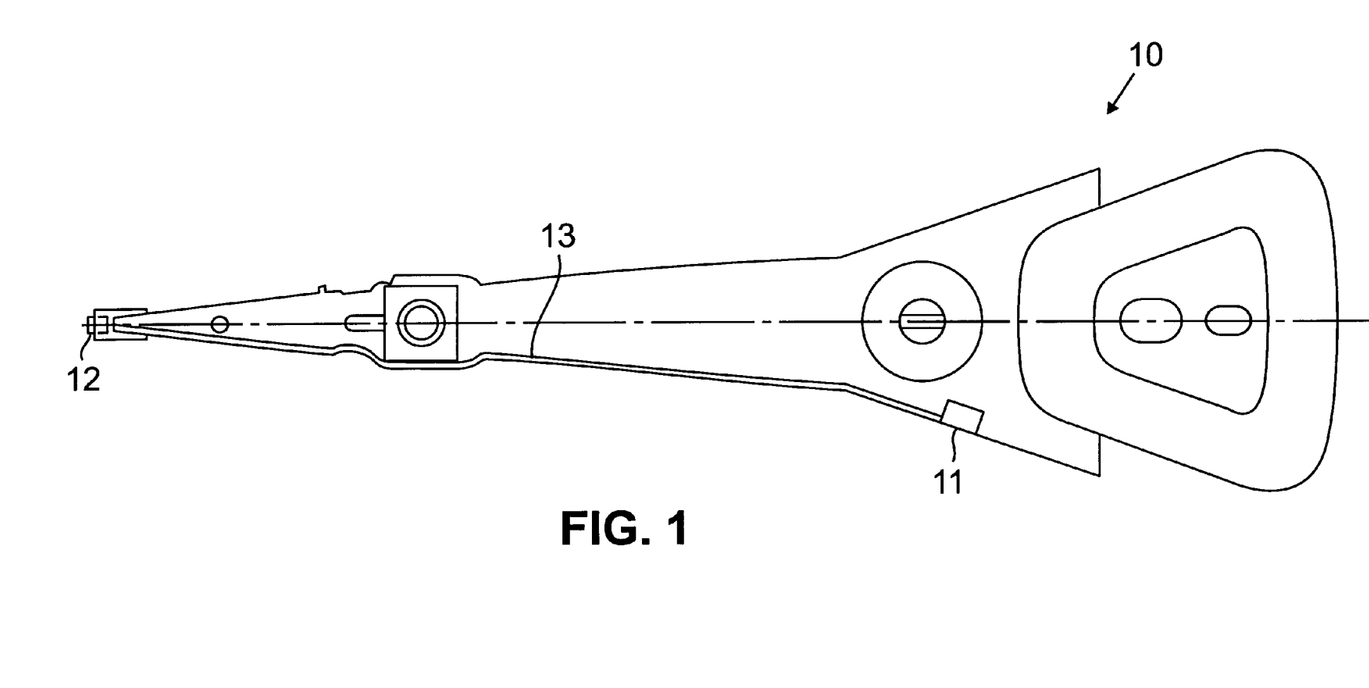
FIG. 1 is a diagram illustrating a typical disk drive arm.

FIG. 1 is a diagram illustrating typical disk drive arm 10. Disk drive arm 10 includes preamplifier 11 operatively connected to read head 12 by interconnect 13. Interconnect 13 is typically about two inches long. Read head 12 is typically an MR element having a resistance of about 30 $\Omega$ to about 80 $\Omega$. Interconnect 13 typically has a characteristic impedance of about 100 $\Omega$, which is not necessarily well matched with read head 12. It is desirable to impedance match preamplifier 11 to interconnect 13 as well, in a manner that does not incur an unacceptable increase in noise that would degrade the performance of preamplifier 11.

Figure 2:
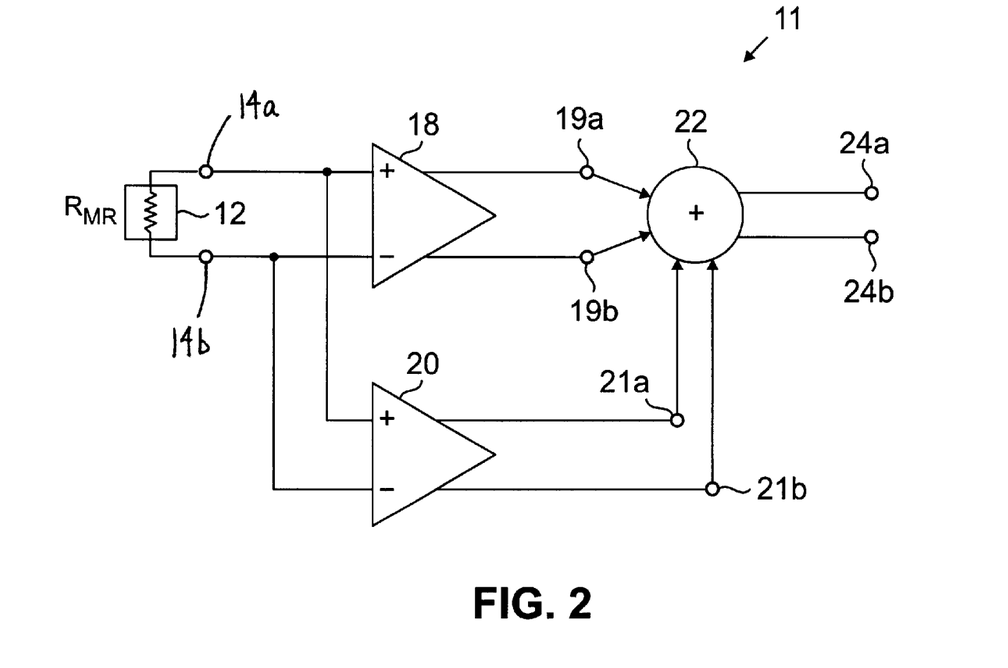
FIG. 2 is a schematic diagram of a dual-sense preamplifier according to the present invention.

FIG. 2 is a schematic diagram of dual-sense preamplifier 11 according to the present invention. Terminals 14a and 14b are provided for connection to opposite sides of read head 12, which has a resistance designated $R_{MR}$. Voltage-sense preamplifier 18 is connected with a positive input connected to terminal 14a and a negative input connected to terminal 14b. Current-sense preamplifier 20 is connected with a positive input connected to terminal 14a and a negative input connected to terminal 14b. Outputs 19a and 19b of voltage-sense preamplifier 18 and outputs 21a and 21b of current-sense preamplifier 20 are connected to the inputs of summing circuit 22, which combines voltage-sense outputs 19a, 19b and current-sense outputs 21a and 21b into preamplifier outputs 24a and 24b.

As discussed above, it is advantageous for the impedance of preamplifier system 11 to match the impedance of the transmission line connecting read head 12 to preamplifier system 11. In the configuration shown in FIG. 2, the effective impedance of preamplifier system is defined by the input impedance of voltage-sense preamplifier 18 in parallel with the input impedance of current-sense preamplifier 20, which is governed by the following equation:

$$R_{preamp} = \frac{R_{vs} \cdot R_{cs}}{R_{vs} + R_{cs}} \quad \text{(Eq. 1)}$$

where $R_{preamp}$ is the total input impedance of preamplifier system 11, $R_{vs}$ is the input impedance of voltage-sense preamplifier 18, and $R_{cs}$ is the input impedance of current-sense preamplifier 20. The input impedance of voltage-sense preamplifier 18 is universally much greater than the input impedance of current-sense preamplifier 20, since the input of voltage-sense preamplifier 18 looks into a high impedance transistor base while the input of current-sense preamplifier 20 looks into a lower impedance transistor emitter. Thus, Equation 1 above simplifies into the following:

$$R_{preamp} \approx \frac{R_{vs} \cdot R_{cs}}{R_{vs}} \approx R_{cs} \quad \text{(Eq. 2)}$$

Impedance matching preamplifier system 11 to the transmission line connecting to read head 12 therefore can be done by controlling the input impedance of current-sense preamplifier 20 to be equal to the impedance of the transmission line. As discussed above, this is traditionally done at the expense of the effective gain of the current-sense preamplifier. However, in the dual-sense configuration of FIG. 2, the reduced gain of current-sense preamplifier 20 is tolerable because both voltage-sense preamplifier 18 and current-sense preamplifier 20 are employed, bringing the total gain of preamplifier system 11 back to acceptable levels.

In the configuration shown in FIG. 2, both voltage-sense preamplifier 18 and current-sense preamplifier 20 have gain and noise associated therewith. In particular, both voltage-sense preamplifier 18 and current-sense preamplifier 20 experience voltage noise, current noise and correlated noise. Of these noise sources, the correlated noise associated with current-sense preamplifier 20 is the most significant noise source of dual-sense preamplifier system 11. However, in preamplifier system 11, correlated noise will also manifest itself through voltage-sense preamplifier 18 with an opposite polarity of the correlated noise associated with current-sense preamplifier 18. Therefore, if the gain of voltage-sense preamplifier 18 and current-sense preamplifier 20 are made equal, the correlated noise associated with current-sense preamplifier 20 will be canceled out at summing circuit 22 by the opposite polarity correlated noise associated with voltage-sense preamplifier 18. Although current noise and voltage noise components will still exist in both voltage-sense preamplifier 18 and current-sense preamplifier 20, the cancellation of the correlated noise brings the performance of preamplifier system 11 well within acceptable levels.

Figure 3A:
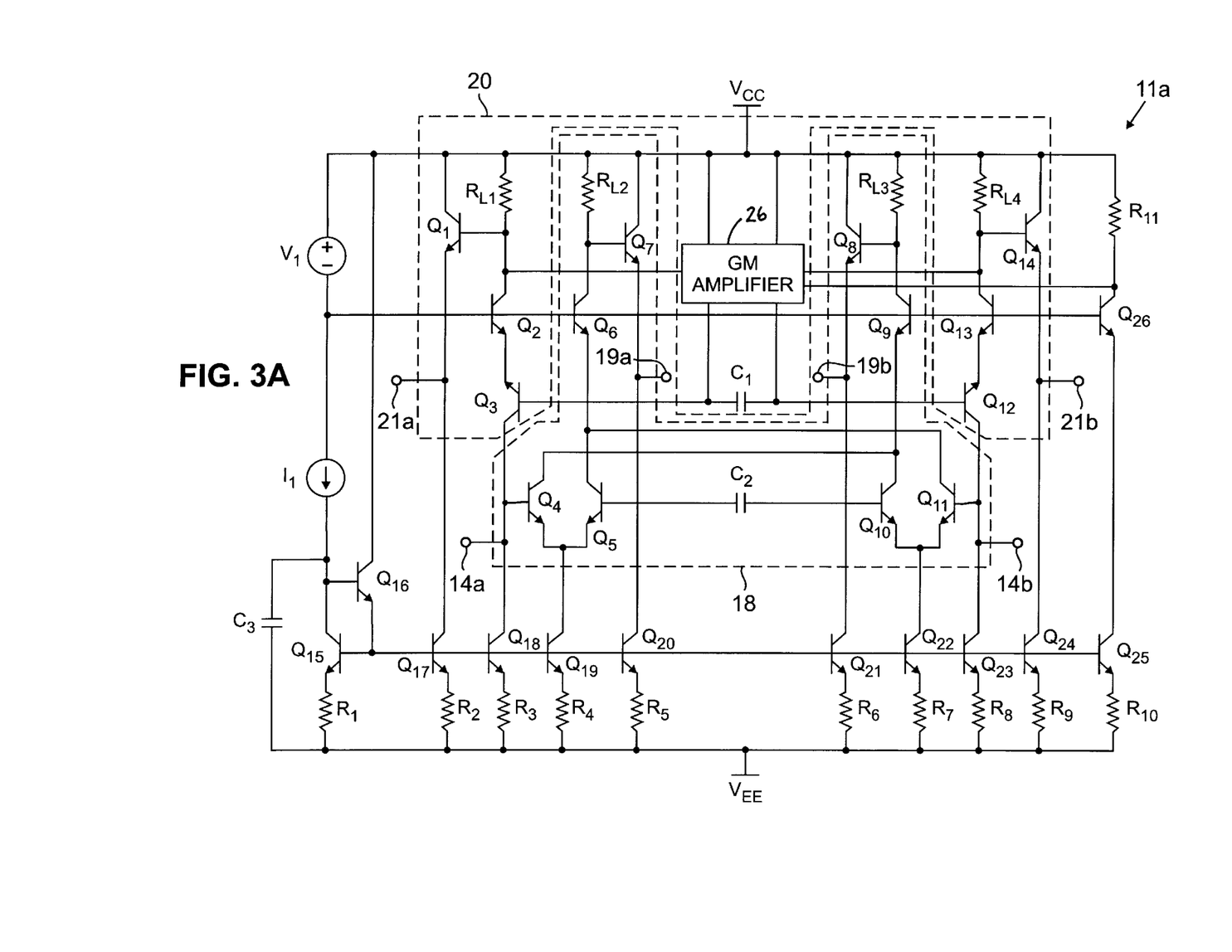
FIGS. 3A and 3B are schematic diagrams illustrating an exemplary configuration of the dual-sense preamplifier of the present invention.
Figure 3B:
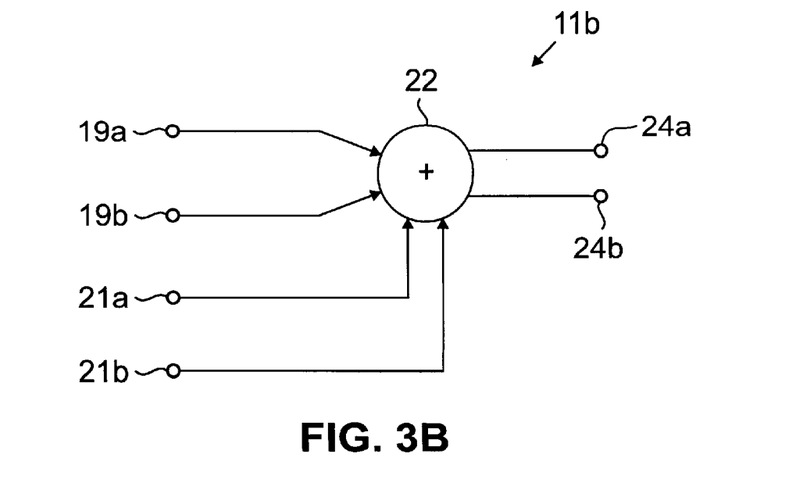

FIGS. 3A and 3B are schematic diagrams of an exemplary configuration of preamplifier system 11. FIG. 3A illustrates first preamplifier portion 11a, including voltage-sense preamplifier 18 and current-sense preamplifier 20, and FIG. 3B illustrates second preamplifier portion 11b, including summing circuit 22. As shown in FIG. 3A, first preamplifier portion 11a includes voltage source V1, current source I1, capacitors C1–C3, resistors R1–R11, load resistors $R_{L1}$–$R_{L4}$, transistors Q1–Q25 and a Gm amplifier. More particularly, voltage-sense preamplifier 18 includes capacitor C2, transistors Q4–Q11 and load resistors $R_{L2}$ and $R_{L3}$, while current-sense preamplifier 20 includes capacitor C1, transistors Q1–Q3 and Q12–Q14 and load resistors $R_{L1}$ and $R_{L4}$. Voltage source V1, current source I1, capacitor C3 and transistors Q15 and Q16 are connected to bias voltage-sense preamplifier 18 and current-sense preamplifier 20 appropriately. Transistors Q17, Q18, Q23 and Q24 and resistors R2, R3, R8 and R9 are connected to mirror biasing currents to current-sense preamplifier 20, and transistors Q19–Q22 and resistors R4–R7 are connected to mirror biasing currents to voltage-sense preamplifier 18. Input terminal 14a is connected to voltage-sense preamplifier 18 at the base of transistor Q4 and is connected to current-sense preamplifier 20 at the emitter of transistor Q3. Input terminal 14b is connected to voltage-sense preamplifier 18 at the base of transistor Q11 and is connected to current-sense preamplifier at the emitter of transistor Q12. Output terminal 19a of voltage-sense preamplifier 18 is connected to the emitter of transistor Q7, and output terminal 19b of voltage-sense preamplifier 18 is connected to the emitter of transistor Q8. Output terminal 21a of current-sense preamplifier 20 is connected to the emitter of transistor Q1, and output terminal 21b of current-sense preamplifier 20 is connected to the emitter of transistor Q14. Gm amplifier 26 is connected to the bases of transistors Q1, Q3, Q12 and Q14, and is connected to the collector of transistor Q26, in a manner well known in the art to ensure proper biasing of the components of voltage-sense preamplifier 18 and current-sense preamplifier 20.

Voltage-sense preamplifier 18 and current-sense preamplifier 20 are each configured in a classic, traditional manner. Voltage-sense preamplifier 18 is connected in a differential common-emitter amplifier arrangement that is well known in the art. Current-sense preamplifier 20 is connected in a differential common-base amplifier arrangement that is also well known in the art. The present invention marks the first disk drive preamplifier system to employ both a voltage-sense amplifier and a current-sense amplifier in parallel, which allows effective impedance matching to the interconnect to be achieved without incurring unacceptable noise penalties.

FIG. 3B shows second preamplifier portion 11b, where voltage-sense output terminals 19a and 19b and current-sense output terminals 21a and 21b are all connected to summing circuit 22 for combination into a single preamplifier output. The output of summing circuit 22 is connected to output terminals 24a and 24b. Because a number of configurations well known in the art may be used to implement summing circuit 22, summing circuit 22 is shown only in schematic form in FIG. 3B.

Figure 4:
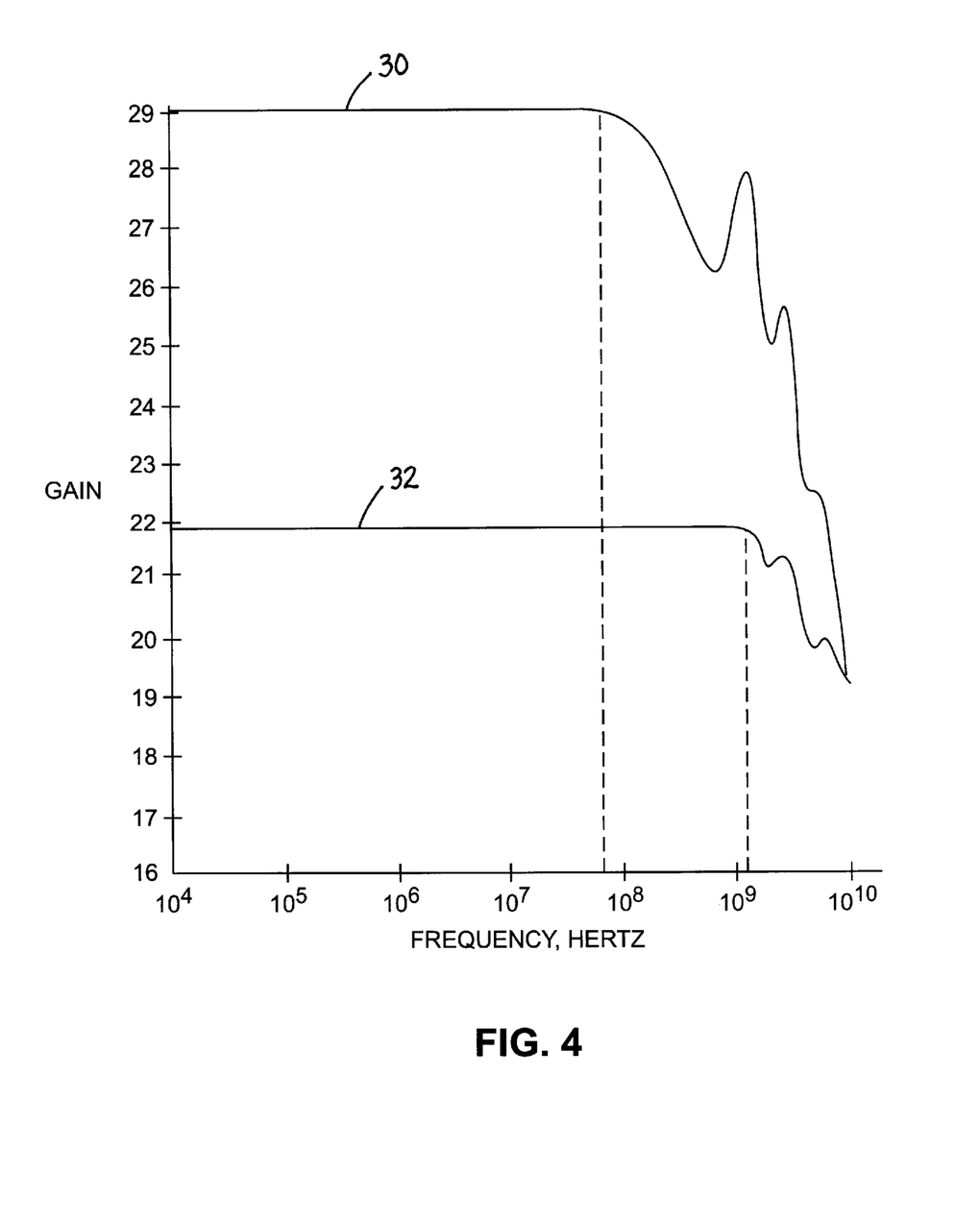
FIG. 4 is a graph illustrating the improved bandwidth achieved by the dual-sense preamplifier of the present invention.

FIG. 4 is a graph illustrating the relative performance of a prior art preamplifier that is not impedance matched and impedance matched preamplifier system 11 of the present invention. Curve 30 illustrates the gain of the prior art preamplifier. At frequencies above about 100 mega-Hertz (MHz), the response of the prior art preamplifier is distorted and inaccuracies in data recovery would occur at these high frequencies. Curve 32 illustrates the gain of preamplifier system 11 of the present invention. Although the magnitude of the gain is slightly reduced from the gain of prior art preamplifiers, the gain is still sufficiently high for disk drive applications. Notably, the response of preamplifier system 11 of the present invention remains undistorted up to frequencies exceeding 1 giga-Hertz (GHz), which is typically the resonant frequency of preamplifier system 11. As a result, the effective preamplifier bandwidth is increased significantly over the prior art.

Mathematical Analysis

In order to more thoroughly explain the bandwidth and noise performance of preamplifier system 11 of the present invention, a mathematical analysis may be performed. For the purposes of the mathematic analysis it should be assumed that preamplifier system 11, which contains the reader circuitry, is connected to write head 12 with approximately two inches of interconnect. This interconnect is commonly 100 Ohms differential impedance ($Z_{DIFF}$) and 30 Ohms common-mode impedance ($Z_{CM}$) and has a 250 psec propagation delay time ($\tau$). The read head is typically between 30 and 80 Ohms ($\Omega$).

FIG. 3A depicts the schematic of the impedance-matched dual-sense reader of the present invention. This schematic depicts current-sense reader 20 and a voltage-sense reader 18. The sense transistors for current-sense reader 20 are devices Q3 and Q12. The sense transistors for voltage-sense reader 18 are devices Q4 and Q11. The outputs of the current-sense and voltage-sense input transistors are wire-ORed together at the cascode transistors Q2 and Q13. The outputs of the voltage-sense and current-sense devices are wire-ORed together in such a way as the polarity of the amplified signal is added together at the output of the two sense-amplifiers. For example, if the voltage goes high on terminal 14a and low on terminal 14b, the current-sense device Q3 will be biased off (or more off) while the current-sense device Q12 will be biased on (or more on). At the same time, the voltage-sense device Q4 will be biased on (or more on) while the voltage-sense device Q11 will be biased off (or more off). The collectors of Q3 and Q11 are connected together, and both are biased off (or more off). Meanwhile, the collectors of Q12 and Q4 are connected together, and these two devices are both biased on (or more on). Therefore, the gain of the current-sense and voltage-sense amplifiers is additive.

In order to determine whether the dual-sense impedance-matched amplifier is practicable, one must determine if the input referred noise of the dual-sense scheme is comparable to the simple current-sense and voltage-sense schemes. In evaluating a reader architecture, one must determine the input referred noise of each significant noise-component. Ultimately, one is interested in the signal-to-noise ratio of the amplifier.

$$SNR \equiv 20 \log\left(\frac{V_{SIGNAL}}{V_{NOISE}^{INPUT-REFERRED}}\right) \quad \text{(Eq. 3)}$$

One typically does not know what amplitude the signal from the MR element will be, though. Referring each noise source to the input allows for comparative analyses of different architectures. It is here at the input that the signal is introduced, and this signal is independent of preamplifier architecture at this location. If one knows the amplitude of the preamplifier noise referred to this point, the signal-to-noise can be easily computed once the signal amplitude is known. More importantly, one can compare the noise amplitudes of different architectures when using input referred numbers. The difference of the signal-to-noise ratios of two different architectures is:

$$\Delta SNR = 20 \log\left(\frac{V_{NOISE}^{INPUT-REFERRED}(\text{architecture \#1})}{V_{NOISE}^{INPUT-REFERRED}(\text{architecture \#2})}\right) \quad \text{(Eq. 4)}$$

Note that one does not need to know the signal amplitude when comparing the SNR of two architectures.

First, the thermal noise of the base resistance of one of the current-sense transistors will be input referred. The noise-voltage associated with this source is:

$$\frac{V_N(r_b^{IS})}{\sqrt{\Delta f}} = \sqrt{4kTr_b} \quad \text{(Eq. 5)}$$

One must now determine what percentage of this noise-voltage presents itself across the input of the preamplifier. Solving for the voltage across the preamplifier yields:

$$\frac{V_{PA}}{\sqrt{\Delta f}} = \frac{V_N(r_b^{IS})}{\sqrt{\Delta f}} \frac{Z_{EQ}\|2R_B}{Z_{EQ}\|2R_B + 2r_e^{IS}} \quad \text{(Eq. 6)}$$

$$= \frac{V_N(r_b^{IS})}{\sqrt{\Delta f}} \frac{Z_{EQ}\|R_{PA}}{2r_e^{IS}} \equiv V_N(r_b^{IS}) \cdot F$$

Here, $Z_{EQ}$ is the equivalent impedance of the input network as seen by the preamp, and $R_{PA}$ is the input impedance of the preamp and is equal to the parallel combination of $2r_e$ and $2R_B$. $Z_{EQ}$ is given by:

$$Z_{EQ} = Z_{TL}\frac{R_{MR}\cos\omega\tau + jZ_{TL}\sin\omega\tau}{Z_{TL}\cos\omega\tau + jR_{MR}\sin\omega\tau} \quad \text{(Eq. 7)}$$

Eq. 6 states that a fraction (F) of the noise-voltage appears across the terminals of voltage-sense amplifier 18. The remainder of the noise-voltage appears across the terminals of current-sense amplifier 20. Notice that the noise-voltage of the base resistance generates signals in voltage-sense amplifier 18 and current-sense amplifier 20 of opposite polarities. This is beneficial in that the noise of this source will be partially cancelled. The sum of the signals from the two sense-schemes is given by:

$$\frac{I_N^{OUT}}{\sqrt{\Delta f}} = \frac{V_N(r_b^{IS})}{\sqrt{\Delta f}}[F \cdot g_m^{VS} - (1-F)g_m^{IS}] \quad \text{(Eq. 8)}$$

To input refer this noise, the previous equation must be divided by the product of the amplifier gain and the input network gain:

$$\frac{V_N^{input-referred}(r_b^{IS})}{\sqrt{\Delta f}} = \frac{I_N^{OUT}}{(g_m^{IS} + g_m^{VS})A_V} \quad \text{(Eq. 9)}$$

Here, $A_v$ is the gain of the input network and is given by:

$$A_V = \frac{R_{PA}Z_{TL}}{Z_{TL}(R_{PA} + R_{MR})\cos\omega\tau + j(R_{PA}R_{MR} + Z_{TL}^2)\sin\omega\tau} \quad \text{(Eq. 10)}$$

Notice that the gain of the input network has a magnitude that becomes independent of frequency if the input impedance of the preamplifier matches the interconnect differential impedance ($R_{PA}=Z_{TL}$). The phase of the input network gain is simply due to the propagation delay of the transmission line. Solving the above equations yields:

$$\frac{V_N^{input-referred}(r_b^{IS})}{\sqrt{\Delta f}} = \sqrt{4kTr_b} \left[ \left( \frac{g_m^{VS}}{g_m^{PA}} \frac{R_{MR}}{R_{PA}} - \frac{g_m^{IS}}{g_m^{PA}} \right)\cos\omega\tau + j\left( \frac{g_m^{VS}}{g_m^{PA}} \frac{Z_{TL}}{R_{PA}} - \frac{g_m^{IS}}{g_m^{PA}} \frac{R_{MR}}{R_{PA}} \right)\sin\omega\tau \right] \quad \text{(Eq. 11)}$$

Let us now compare this to the input referred noise of the same device when used in a traditional current-sense amplifier.

$$\frac{V_N^{input-referred}(r_b^{IS})}{\sqrt{\Delta f}} = \sqrt{4kTr_b} \frac{R_{MR}\cos\omega\tau + jZ_{TL}\sin\omega\tau}{R_{PA}} \quad \text{(Eq. 12)}$$

Notice that the cosine term and sine term of the dual-sense scheme each has two terms, the first representing the noise amplified by the voltage-sense part and the second representing the noise amplified by the current-sense part. The total noise is the difference of the two terms and the amplifiers are out of phase with regard to this noise component. Also notice that the first term of both the sine and cosine terms is nearly identical to the noise of the traditional current-sense amplifier. Even this term is modestly smaller in the dual sense scheme. Notice also that the frequency response is flat when the preamplifier is properly impedance-matched to the transmission line. Finally, notice that if the $g_m$ of the current-sense is equal to the $g_m$ of the voltage-sense, the noise cancellation is nearly total.

The remaining noise components will be given without showing their derivations. Below is the noise of the MR element itself.

$$\frac{V_N^{input-referred}(R_{MR})}{\sqrt{\Delta f}} = \sqrt{4kTR_{MR}} \quad \text{(Eq. 13)}$$

The bias resistors present an input-referred noise identical to that of the simple sense schemes.

$$\frac{V_N^{input-referred}(R_B)}{\sqrt{\Delta f}} = \sqrt{\frac{kT}{R_B}} (R_{MR}\cos\omega\tau + jZ_{TL}\sin\omega\tau) \quad \text{(Eq. 14)}$$

The collector current shot noise of the current-sense device presents the following noise to the input.

$$\frac{V_N^{input-referred}(I_C^{IS})}{\sqrt{\Delta f}} = \sqrt{2qI_C} \left[ \left( \frac{R_{MR}}{2} - \frac{R_{MR}}{R_{PA}g_m^{PA}} - \frac{1}{g_m^{PA}} \right)\cos\omega\tau + j\left( \frac{Z_{TL}}{2} - \frac{Z_{TL}}{R_{PA}g_m^{PA}} - \frac{R_{MR}}{Z_{TL}g_m^{PA}} \right)\sin\omega\tau \right] \quad \text{(Eq. 15)}$$

The voltage-sense device also presents two significant noise components. First is the component associated with the thermal noise of the base resistance.

$$\frac{V_N^{input-referred}(r_b^{VS})}{\sqrt{\Delta f}} = \sqrt{4kTr_b} \frac{g_m^{VS}}{g_m^{PA}} \left( \frac{R_{PA} + R_{MR}}{R_{PA}}\cos\omega\tau + j\frac{R_{PA}R_{MR} + Z_{TL}^2}{R_{PA}Z_{TL}}\sin\omega\tau \right) \quad \text{(Eq. 16)}$$

The second is the input-referred noise of the collector current shot noise of the input device.

$$\frac{V_N^{input-referred}(I_C^{VS})}{\sqrt{\Delta f}} = \sqrt{2qI_C} \left( \frac{R_{PA} + R_{MR}}{R_{PA}g_m^{PA}}\cos\omega\tau + j\frac{R_{PA}R_{MR} + Z_{TL}^2}{R_{PA}Z_{TL}g_m^{PA}}\sin\omega\tau \right) \quad \text{(Eq. 17)}$$

There are several of observations to be made. First, the collector current shot noise of the current-sense device also sees noise cancellation due to the architecture. The noise terms associated with the current-sense device exhibit both voltage noise and current noise. Furthermore, the voltage and current noises are correlated. Thus, separating these into voltage and current noise components would likely result in erroneous total noise calculations, as typically these components are mostly uncorrelated. The noise terms associated with the voltage-sense scheme are smaller than their counterparts for a traditional voltage-sense scheme. This is because the dual-sense architecture has more gain than the voltage-sense architecture alone. The noise of the dual-sense architecture can actually be lower than for a traditional voltage-sense or current-sense architecture alone, even when the current-sense portion of this architecture is of low gain for proper impedance-matching.

When the simple dual-sense circuitry is optimized for minimum noise (assuming 50 Ohms input impedance), the sum of the tail currents for the voltage-sense and current-sense portions is only 6 mA. This results in a very low power solution. The integrated noise figure for this preamplifier is 3.1 dB, 3.3 dB, and 3.1 dB for 30, 50, and 80 Ohm RMR values, respectively. This integrated noise figure is over the pass-band of 5 MHz to 1.205 GHz.

The simple dual-sense architecture is not as low noise as the traditional voltage-sense scheme. Even though each individual noise component is lower than the corresponding component in a voltage-sense or current-sense architecture, the sum of all the terms tends to be slightly larger for the dual-sense scheme. This is because there are more noise sources in the dual-sense scheme than in either traditional sense architecture.

The largest single noise component in the noise-minimized solution is the collector current shot noise of the voltage-sense differential pair. This component is roughly four times bigger than the next largest noise contributor. It is easy to understand why this becomes the dominant noise contributor if one examines the sum of the noise contributors. To minimize the noise contributions of the current-sense portion of the amplifier, the gain of the voltage-sense amplifier should be made small (on the order of the gain of the current-sense amplifier). In the simple dual-sense architecture given, the gain of the voltage sense amplifier is intimately related to the collector current shot noise. By reducing the tail current of the differential pair, its gain is reduced. This happens at the expense of increasing the input-referred collector-current shot-noise.

This relationship between voltage-sense gain and shot noise needs to be dissolved in order to obtain further noise improvements. This is quite simply done by giving the voltage-sense amplifier its own load resistor pair. The addition of the current-sense and voltage-sense gain can then take place in the second stage.

Voltage-sense amplifier 18 and current-sense amplifier 20 have independent load resistors $R_{L1}$–$R_{L4}$. This allows an increase in the tail current of the voltage-sense differential pair while decreasing the value of the voltage-sense load resistor. Because the input-referred collector current shot noise is proportional to the inverse of the square root of the tail current, shot noise can be decreased. Furthermore, the gain of the voltage-sense amplifier is now independent of the current-sense amplifier. Thus the gain can be optimized for noise cancellation of the current-sense amplifier. The outputs of the two amplifiers can then be simply added in the second stage, as shown in FIG. 3B.

The noise of this amplifier can be minimized quite well. Input referred noise is no greater than about 1.2 nano-Volts per Hertz $^{1/2}$ in an exemplary embodiment.

The addition of the current-sense and voltage-sense components needs to be in phase. This is not difficult to do but does warrant the requisite attention. The noise minimized solution results in a voltage-sense amplifier with about 16 mA of tail current. Noise minimized means that the tail current that makes the collector current shot noise equal in magnitude to the thermal noise of the base for the voltage-sense differential pair used here. Increasing the tail current more results in diminishing returns. The noise minimized solution results in the voltage-sense amplifier having a gain of two times the gain of the current-sense portion. This results in load resistors for the voltage-sense part to be only one-eighth as large as the load resistors of the current-sense part. Thus, the load resistors of the current-sense amplifier will determine the frequency response of the preamplifier. These will be made as large as can accommodate the required first stage bandwidth. The current-sense load then determines the voltage-sense load resistors. The frequency response of the two amplifiers needs to be identical, however, for correct noise cancellation. Thus, the cascode devices of the voltage-sense part are made eight times larger than the current-sense counterparts in order to ensure equal RC time constants.

The feedback loops have not been explicitly given in the schematics for the sake of simplicity (with the exception of the differential $g_m$ amplifier on the current-sense bypass capacitor). The current-sense bypass capacitor requires a common-mode $g_m$ amplifier also to establish a $V_{MR}$ of zero volts. The voltage-sense bypass capacitor requires a double ended $g_m$ amplifier to balance the two differential pairs. None of these amplifiers are problematic.

The response of a preamplifier is limited by the input network. This response has previously been given in Equation 10. The dual-sense architecture can present an impedance-matched input when the tail current of the current-sense amplifier is set properly. The input impedance of the dual-sense architecture is simply the parallel combination of the input impedances of the current-sense and voltage-sense amplifiers used. The input impedance of the current sense amplifier is as follows:

$$R_{IN} \approx 2r_e \frac{1 + j\omega R_B C_\pi}{1 + j\omega r_e C_\pi} \quad \text{(Eq. 18)}$$

The pole and zero frequencies of this equation are both quite high. This is the advantage of current-sense preamplifiers. The input impedance of a current-sense amplifier is virtually frequency independent, even for high-end data rates. The pole frequency is $f_\tau$ of the transistor. The zero frequency is simply the pole frequency times the ratio of $(R_B/r_e)$.

The variation of the input impedance of the voltage-sense amplifier can be problematic. The input impedance of an emitter follower is given below:

$$R_{IN} \approx \frac{2\beta r_e}{1 + j\omega \beta r_e (C_\pi + C_\mu)} \quad \text{(Eq. 19)}$$

The pole frequency is very low here. For all practical purposes, the input impedance of a voltage-sense amplifier can be simply approximated as a capacitance $(C_\pi + C_v)/2$. The frequency at which this impedance significantly affects the response is determined when the input impedance is equal to the input impedance of the current-sense architecture. Even this relaxed requirement, however, results in a fairly low frequency. This is a result of the large diffusion capacitance associated with large tail current emitter followers. Improvements in $f_\tau$ give corresponding improvements in the input impedance response.

If one used a voltage-sense amplifier of the variety in which the input device drives the bypass capacitor, the input impedance frequency variation becomes even worse. The input impedance of this type of system is given by:

$$R_{IN} \approx \frac{\beta + j\omega R_\pi (C_\pi + C_E)}{j\omega C_E (1 + j\omega R_\pi C_\pi)} \approx \frac{\beta}{j\omega C_E (1 + j\omega R_\pi C_\pi)} \quad \text{(Eq. 20)}$$

Negative impedance is achieved by this equation at high frequencies. Undistorted frequency response is achieved even at resonance.

The impedance-matched dual-sense architecture has an input-impedance that is constant to very high frequencies. This is in part because no feedback was used in generating an impedance-matched front end. This frequency independent input-impedance results in a response that is also frequency independent if the input-impedance of the amplifier is equal to the differential-impedance of the transmission line. This input-impedance is determined by the bias current of the current-sense amplifier, making it an easily programmable feature (programmable input impedance).

The architecture has a simple implementation that results in a low-power reader. This architecture is perhaps suitable for a desktop application. The architecture also has a low-noise solution comparable or better than the best high-end architectures to date. This makes the architecture worthy of consideration for the high-end preamplifier programs as well.

Any voltage-sense and current-sense architectures may be used in the dual-sense preamplifier. It is the proper relationship between the gains of the current-sense and voltage-sense architectures that result in a minimum noise solution. The frequency at which the input-impedance begins to become small is typically determined by the capacitance of the voltage-sense amplifier. Architectural and process improvements to the voltage-sense architecture will provide continued improvements to the dual-sense architecture as well.

Although the present invention has been described with reference to preferred embodiments, workers skilled in the art will recognize that changes may be made in form and detail without departing from the spirit and scope of the invention. Particularly, while the invention is described in terms of bipolar junction transistors, it should be understood that other comparable switching devices may also be used to implement the present invention. In addition, while the invention is described in the form of discrete devices, it is recognized that the circuit is preferably reduced to practice in the form of an integrated circuit (IC). Therefore, terms such as "device" and the like should be construed in their broadest contexts to include portions of IC's that are conveniently described as functional components, as well as discrete devices.

What is claimed is:

1. A preamplifier system for connection through an interconnect to a read head, the preamplifier system comprising:
    a voltage-sense preamplifier having at least one input for connection through the interconnect to the read head and having at least one output, the voltage-sense preamplifier providing a continual preamplification function during operation of the system;
    a current-sense preamplifier having at least one input for connection through the interconnect to the read head and having at least one output, the current-sense preamplifier providing a continual preamplification function during operation of the system; and
    a summing circuit connected to combine the outputs of the voltage-sense preamplifier and the current-sense preamplifier.

2. The preamplifier system of claim 1, wherein the voltage-sense preamplifier has a first gain and the current-sense preamplifier has a second gain equal to the first gain.

3. The preamplifier system of claim 1, wherein the current-sense preamplifier has an input impedance that matches a characteristic impedance of the interconnect.

4. The preamplifier system of claim 1, wherein an output of the summing circuit is undistorted up to a frequency exceeding a resonant frequency of the preamplifier system.

5. The preamplifier system of claim 4, wherein the resonant frequency of the preamplifier system is about 1 giga-Hertz (GHz).

6. The preamplifier system of claim 1, wherein an output of the summing circuit has an integrated noise figure of no greater than about 3.3 dB.

7. The preamplifier of claim 1, wherein the voltage-sense preamplifier is connected in a common-emitter configuration.

8. The preamplifier system of claim 1, wherein the current-sense preamplifier is connected in a common-base configuration.

9. The preamplifier system of claim 1, wherein the voltage-sense preamplifier, the current-sense preamplifier and the summing circuit are implemented in an integrated circuit.

10. A disk drive having a read system supported by an arm over a surface of a rotatable disk, the read system comprising:
    a read head;
    an interconnect having first and second inputs connected to opposite sides of the read head and having first and second outputs; and
    a preamplifier system operatively connected to the first and second outputs of the interconnect, the preamplifier system comprising:
        a voltage-sense preamplifier having first and second inputs connected respectively to the first and second outputs of the interconnect, and having first and second outputs, the voltage-sense preamplifier providing a continual preamplification function during operation of the system;
        a current-sense preamplifier having first and second inputs connected respectively to the first and second outputs of the interconnect, and having first and second outputs, the current-sense preamplifier providing a continual preamplification function during operation of the system; and
        a summing circuit connected to combine the outputs of the voltage-sense preamplifier and the current-sense preamplifier.

11. The disk drive of claim 10, wherein the voltage-sense preamplifier has a first gain and the current-sense preamplifier has a second gain equal to the first gain.

12. The disk drive of claim 10, wherein the current-sense preamplifier has an input impedance that matches a characteristic impedance of the interconnect.

13. The disk drive of claim 10, wherein an output of the summing circuit is undistorted up to a frequency exceeding a resonant frequency of the preamplifier system.

14. The disk drive of claim 13, wherein the resonant frequency of the preamplifier system is about 1 giga-Hertz (GHz).

15. The disk drive of claim 10, wherein an output of the summing circuit has an integrated noise figure of no greater than about 3.3 dB.

16. The disk drive of claim 10, wherein the voltage-sense preamplifier is connected in a common-emitter configuration.

17. The disk drive of claim 10, wherein the current-sense preamplifier is connected in a common-base configuration.

18. The disk drive of claim 10, wherein the preamplifier is implemented in an integrated circuit.

19. A preamplifier system for connection through an interconnect to a read head, the interconnect having first and second inputs connected to opposite sides of the read head, having first and second outputs and having a characteristic impedance, the preamplifier system comprising:
    a voltage-sense preamplifier having first and second inputs for connection respectively to the first and second outputs of the interconnect, having first and second outputs, having an input impedance, and having a gain;
    a current-sense preamplifier having first and second inputs for connection respectively to the first and second outputs of the interconnect, having first and second outputs, having an input impedance such that the input impedance of the voltage-sense preamplifier in parallel with the input impedance of the current-sense preamplifier is substantially equal to the characteristic impedance of the interconnect, and having a gain equal to the gain of the voltage-sense preamplifier; and
    a summing circuit connected to combine the outputs of the voltage-sense preamplifier and the current-sense preamplifier.

20. The preamplifier system of claim 19, wherein the voltage-sense preamplifier is connected in a common-emitter configuration.

21. The preamplifier system of claim 19, wherein the current-sense preamplifier is connected in a common-base configuration.

22. The preamplifier system of claim 19, wherein the voltage-sense preamplifier, the current-sense preamplifier and the summing circuit are implemented in an integrated circuit.

* * * * *